United States Patent
Luo et al.

(10) Patent No.: US 11,205,750 B2
(45) Date of Patent: Dec. 21, 2021

(54) 1S1R MEMORY INTEGRATED STRUCTURE WITH LARGER SELECTOR SURFACE AREA WHICH CAN EFFECTIVELY SUPPRESS LEAKAGE CURRENT IN THE CROSS ARRAY WITHOUT INCREASING THE OVERALL SIZE OF THE INTEGRATED STRUCTURE AND METHOD FOR FABRICATING THE SAME

(71) Applicant: Institute of Microelectronics, Chinese Academy of Sciences, Beijing (CN)

(72) Inventors: Qing Luo, Beijing (CN); Hangbing Lv, Beijing (CN); Ming Liu, Beijing (CN); Xiaoxin Xu, Beijing (CN); Cheng Lu, Beijing (CN)

(73) Assignee: Institute of Microelectronics Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/786,346

(22) Filed: Feb. 10, 2020

(65) Prior Publication Data
US 2020/0176674 A1    Jun. 4, 2020

(51) Int. Cl.
*H01L 45/00* (2006.01)
*G11C 13/00* (2006.01)

(52) U.S. Cl.
CPC ...... *H01L 45/1253* (2013.01); *G11C 13/0002* (2013.01); *G11C 13/004* (2013.01);
(Continued)

(58) Field of Classification Search
CPC ............. H01L 45/1253; H01L 45/1233; H01L 45/146; H01L 45/16
See application file for complete search history.

(56) References Cited

U.S. PATENT DOCUMENTS

| | | | |
|---|---|---|---|
| 8,963,275 B2 | 2/2015 | Kang et al. | |
| 10,163,983 B1 * | 12/2018 | Lee | H01B 1/24 |

(Continued)

FOREIGN PATENT DOCUMENTS

| | | |
|---|---|---|
| CN | 101231970 | 7/2008 |
| CN | 101262005 | 9/2008 |

(Continued)

OTHER PUBLICATIONS

International Search Report issued to PCT/CN18/86668, dated Jan. 30, 2019, 3 pages.

(Continued)

*Primary Examiner* — Mushfique Siddique
(74) *Attorney, Agent, or Firm* — Barnes & Thornburg LLP

(57) ABSTRACT

The present disclosure provides a 1S1R memory integrated structure and a method for fabricating the same, wherein the 1S1R memory integrated structure includes: a word line metal, a resistive material layer, a selector lower electrode, a selector material layer, a selector upper electrode, an interconnection wire, and a bit line metal; wherein the selector material layer is in a shape of a groove, and the selector upper electrode is formed in the groove. According to the 1S1R memory integrated structure and its fabricating method in the present disclosure, by the change of the integrated position of the selector, the device area of the selector is much larger than the device area of the memory, which significantly reduces the requirement for the on-state current density of the selector.

7 Claims, 3 Drawing Sheets

(52) U.S. Cl.
CPC ...... *G11C 13/0007* (2013.01); *H01L 45/1233* (2013.01); *H01L 45/146* (2013.01); *H01L 45/16* (2013.01)

(56) References Cited

U.S. PATENT DOCUMENTS

| | | | | |
|---|---|---|---|---|
| 2015/0207069 | A1* | 7/2015 | Cho | H01L 45/147 257/4 |
| 2017/0236869 | A1* | 8/2017 | Tran | H01L 27/2463 257/4 |
| 2017/0288140 | A1 | 10/2017 | Karpov et al. | |
| 2018/0047787 | A1* | 2/2018 | Nakamura | H01L 27/249 |
| 2018/0205017 | A1* | 7/2018 | Bruce | H01L 45/1683 |
| 2019/0221610 | A1* | 7/2019 | Delhougne | H01L 27/11597 |
| 2020/0006428 | A1* | 1/2020 | Jiang | H01L 45/04 |
| 2020/0321395 | A1* | 10/2020 | Doyle | H01L 27/2409 |

FOREIGN PATENT DOCUMENTS

| | | |
|---|---|---|
| CN | 101267017 | 9/2008 |
| CN | 101673755 | 3/2010 |
| CN | 101958336 | 1/2011 |
| CN | 102280465 | 12/2011 |
| CN | 106663683 | 5/2017 |

OTHER PUBLICATIONS

Written Opinion issued to PCT/CN18/86668, dated Jan. 30, 2019, 4 pages.

\* cited by examiner

1S1R MEMORY INTEGRATED STRUCTURE WITH LARGER SELECTOR SURFACE AREA WHICH CAN EFFECTIVELY SUPPRESS LEAKAGE CURRENT IN THE CROSS ARRAY WITHOUT INCREASING THE OVERALL SIZE OF THE INTEGRATED STRUCTURE AND METHOD FOR FABRICATING THE SAME

CROSS-REFERENCE TO RELATED APPLICATION

This application is the National Phase of the PCT Application No. PCT/CN2018/086668, filed on May 14, 2018 and entitled "1S1R Memory Integrated Structure And Method For Fabricating The Same", which is incorporated herein by reference entirely.

TECHNICAL FIELD

The present disclosure belongs to the field of microelectronics manufacturing and memory technology, and in particular, to a 1S1R memory integrated structure and a method for fabricating the same.

BACKGROUND

The memory plays an important role in the semiconductor market and may be generally classified into the volatile memory and the non-volatile memory. The volatile memory means that the information in the memory can only be maintained when the power is applied, and the information stored therein will be lost when the power is not applied. Whereas the main feature of the non-volatile memory is that it is capable of maintaining the information stored therein for a long time without power. With the increasing popularity of portable electronic devices, the non-volatile memory is becoming more and more important in embedded applications. Due to the explosive expansion of emerging markets such as the Internet of Things, artificial intelligence, smart cars and virtual reality, storing and computing large amounts of data in electronic terminals requires high-density embedded memories. Two-terminal devices such as resistive memories or phase change memories are considered to be the most promising memory for future embedded applications because of their simple structure, easy integration, and low power consumption.

Both the resistive memory and the phase change memory have a metal/dielectric layer/metal (MIM) capacitor structure, and the device may be inversely converted between a high resistance state (HRS) and a low resistance state (LRS) by an electrical signal to implement storage functions. Due to the simple structure, it is very advantageous to realize a high-density cross-array structure. The cross-array of single R structures has a reading crosstalk problem due to the presence of a low-impedance current leakage path. To solve this problem, a selector, such as a transistor (1T1R structure) or a diode (1D1R structure), must be connected in series with R. The 1T1R structure cannot be used for 3D integration because the transistor needs to occupy the area of the silicon substrate. In the traditional 1S1R architecture, the selector (1S) and the two-terminal memory (1R) have the same device area (as shown in FIG. 1), which imposes very high requirements on the on-state current density of the selector. Especially for the high operating current of the phase change memory, the on-state current density of the selector is required to be greater than 1 $MA/cm^2$ or even 10 $MA/cm^2$. Most of the selectors are difficult to meet the requirements of high on-state current density, which has become a major problem limiting the large-scale integration of two-terminal memories.

SUMMARY

1. Technical Problems to be Solved

The present disclosure provides a 1S1R memory integrated structure and a method for fabricating the same to at least partially solve the above-mentioned technical problems.

2. Technical Solution

According to an aspect of the present disclosure, a 1S1R memory integrated structure is provided, including: a word line metal, a resistive material layer, a selector lower electrode, a selector material layer, a selector upper electrode, an interconnection wire, and a bit line metal; wherein the selector material layer is in a shape of a groove, and the selector upper electrode is formed in the groove.

In some embodiments, the word line metal is also a memory lower electrode, and the selector lower electrode is also a memory upper electrode and an interconnection wire.

In some embodiments, the resistive material layer is on the word line metal or on the selector upper electrode.

In some embodiments, an area of the selector material layer is greater than an area of the resistive material layer.

In some embodiments, the word line, the bit line, the interconnection wire, the resistive material layer, and the selector material layer are formed by a process of electron beam evaporation, chemical vapor deposition, pulsed laser deposition, atomic layer deposition, or sputtering;

a material of the word line, the bit line and the interconnection wire is W or Cu;

a thickness of the resistive material layer is between 5 nm and 60 nm, and a material of the resistive material layer comprises one or a combination of $ZrO_2$, $HfO_2$, $TiO_2$, $SiO_2$, $Ta_2O_5$, and $Y_2O_3$;

a thickness of the selector material layer is between 5 nm and 60 nm, and a material of the selector material layer is a metal oxide or a mixed ion-electron conducting (MIEC) material; the metal oxide includes one or a combination of $ZrO_2$, $HfO_2$, $TiO_2$, $SiO_2$, $Ta_2O_5$, $Y_2O_3$, $NbO_x$ and $VO_2$.

According to another aspect of the present disclosure, a method for fabricating a 1S1R memory integrated structure is provided, including:

forming, from bottom to top, a word line metal, a resistive material layer and a selector lower electrode;

forming an insulating layer on the selector lower electrode, etching the insulating layer to form a groove structure;

forming a groove-shaped selector material layer in the groove structure;

forming a selector upper electrode in the groove of the selector material layer; and forming sequentially an interconnection wire and a bit line metal on the selector upper electrode.

According to still another aspect of the present disclosure, a method for fabricating a 1S1R memory integrated structure is provided, including:

forming, from bottom to top, a word line metal and a selector lower electrode;

forming an insulating layer on the selector lower electrode, etching the insulating layer to form a groove structure;

forming a groove-shaped selector material layer in the groove structure;

forming a selector upper electrode in the groove of the selector material layer; and forming sequentially a resistive material layer, an interconnection wire and a bit line metal on the selector upper electrode.

In some embodiments, the word line metal is also a memory lower electrode, and the selector lower electrode is a memory upper electrode and an interconnection wire both; an area of the formed selector material layer is greater than an area of the resistive material layer.

In some embodiments, in the etching of the insulating layer, the insulating layer is etched to an upper surface of the interconnection wire, and thus a bottom surface of the groove structure is flush with the upper surface of the interconnection wire.

In some embodiments, the word line, the bit line, the interconnection wire, the resistive material layer, and the selector material layer are formed by a process of electron beam evaporation, chemical vapor deposition, pulsed laser deposition, atomic layer deposition, or sputtering;

a material of the word line, the bit line and the interconnection wire is W or Cu;

a thickness of the resistive material layer is between 5 nm and 60 nm, and a material of the resistive material layer comprises one or a combination of $ZrO_2$, $HfO_2$, $TiO_2$, $SiO_2$, $Ta_2O_5$, and $Y_2O_3$;

a thickness of the selector material layer is between 5 nm and 60 nm, and a material of the selector material layer is a metal oxide or a mixed ion-electron conducting (MIEC) material; the metal oxide includes one or a combination of $ZrO_2$, $HfO_2$, $TiO_2$, $SiO_2$, $Ta_2O_5$, $Y_2O_3$, $NbO_x$ and $VO_2$;

a material of the insulating layer is $SiO_2$.

3. Beneficial Effects

It can be seen from the above technical solution that the 1S1R memory integrated structure and the method for fabricating the same according to the present disclosure have at least one of the following beneficial effects:

(1) In the 1S1R memory integrated structure and the method for fabricating the same according to the present disclosure, through the change of the integrated position of the selector, the device area of the selector is much larger than the device area of the memory, which significantly reduces the requirement for the on-state current density of the selector.

(2) The 1S1R memory integrated structure and the method for fabricating the same according to the present disclosure can effectively suppress leakage current in the cross array without increasing the overall size of the integrated structure.

(3) The 1S1R memory integrated structure and the method for fabricating the same according to the present disclosure effectively increase the device area of the selector compared to the conventional 1S1R integrated structure, so that the selector can provide a larger current.

BRIEF DESCRIPTION OF THE DRAWINGS

The drawings are intended to provide a further understanding of the present disclosure, and form part of the specification. In addition, the drawings together with the specific embodiments below are used to interpret the present disclosure, but do not constitute a restriction on the present disclosure. In the drawings.

COMPONENT DESCRIPTION

Figure 1:
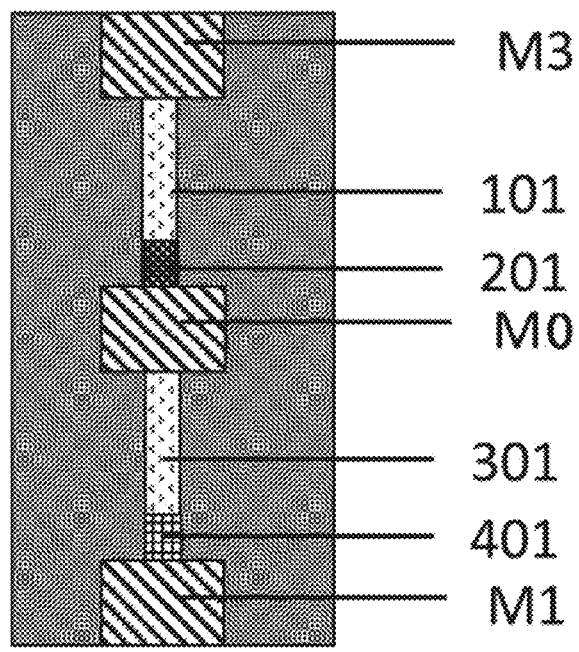
FIG. 1 is a schematic diagram of a conventional 1S1R memory integrated structure.

101-interconnection wire (selector upper electrode), M0-selector lower electrode; 201-selector material layer, 301-interconnection wire, 401-resistive material layer; 102-interconnection wire, 202-selector material layer, 302-interconnection wire (selector lower electrode, memory upper electrode), 402-resistive material layer, 502-insulating layer, 602-deep groove, M1-word line metal (memory lower electrode), M2-selector upper electrode, M3-bit line metal; 103-interconnection wire, 203-selector material layer, 303-interconnection wire (selector lower electrode, memory upper electrode), 403-resistive material layer.

DETAILED DESCRIPTION

To make the objectives, technical solutions, and advantages of the present disclosure clearer, the present disclosure will be further described in detail below in conjunction with the specific embodiments and with reference to the accompanying drawings.

The present disclosure provides a 1S1R memory integrated structure, including: a word line metal, a resistive material layer, a selector lower electrode, a selector material layer, a selector upper electrode, an interconnection wire, and a bit line metal; wherein the selector material layer is in a shape of a groove, and the selector upper electrode is formed in the groove.

In addition, the present disclosure also provides a method for fabricating a 1S1R memory integrated structure, including:

forming, from bottom to top, a word line metal, a resistive material layer and a selector lower electrode;

forming an insulating layer on the selector lower electrode, etching the insulating layer to form a groove structure;

forming a groove-shaped selector material layer in the groove structure;

forming a selector upper electrode in the groove of the selector material layer; and forming sequentially an interconnection wire and a bit line metal on the selector upper electrode.

In addition, the present disclosure also provides another method for fabricating 1S1R memory integrated structure, including:

forming, from bottom to top, a word line metal and a selector lower electrode;

forming an insulating layer on the selector lower electrode, etching the insulating layer to form a groove structure;

forming a groove-shaped selector material layer in the groove structure;

forming a selector upper electrode in the groove of the selector material layer; and forming sequentially a resistive material layer, an interconnection wire and a bit line metal on the selector upper electrode.

Specifically, the word line, the bit line, the interconnection wire, the resistive material layer, and the selector material layer may be formed by a process of electron beam evaporation, chemical vapor deposition, pulsed laser deposition, atomic layer deposition, or sputtering.

In the 1S1R memory integrated structure, the word line metal is also a memory lower electrode, and the selector lower electrode is also a memory upper electrode and an interconnection wire. The resistive material layer may be on the word line metal or on the selector upper electrode. The area of the selector material layer is larger than the area of the resistive material layer.

Figure 2:
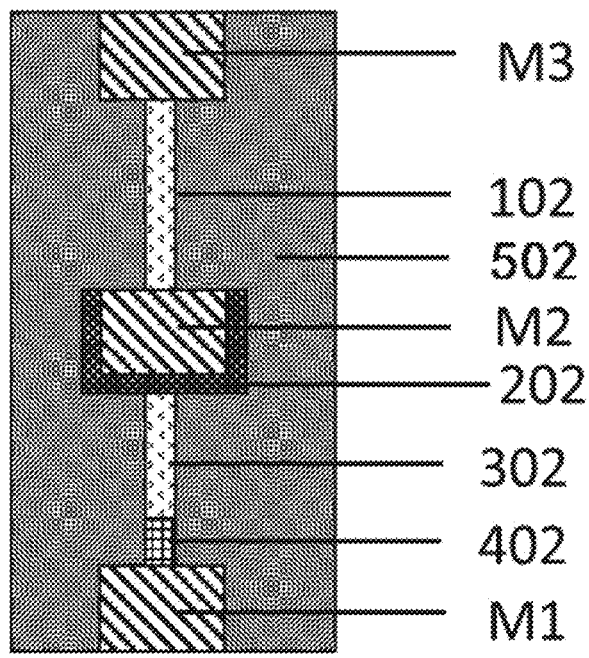
FIG. 2 is a schematic diagram of a 1S1R memory integrated structure according to an embodiment of the present disclosure.

In an embodiment, as shown in FIG. 2, the 1S1R memory integrated structure includes, from bottom to top, a memory word line metal M1 (which is also a memory lower electrode), a resistive material layer 402, a selector lower electrode 302 (which also serves as a resistive memory upper electrode and an interconnection wire), a selector material layer 202, a selector upper electrode M2, an interconnection wire 102 and a bit line metal M3.

As shown in FIG. 2, the selector material layer 202 is in a shape of a groove, and the selector upper electrode M2 is filled in the groove of the selector material layer 202, and the top surface of the selector upper electrode M2 is flush with the top surfaces of both sides of the groove of the selector material layer 202.

The bottom surface of the selector material layer has a larger dimension than the bottom surface of each of the metal electrodes and the interconnection wire. By the change of the integrated position of the selector, the device area of the selector is much larger than the device area of the memory, which significantly reduces the requirement for the on-state current density of the selector.

Specifically, the metal electrodes M1, M2, the bit line metal M3, and the interconnection wires 302 and 102 may be made of a metal element such as W, Cu, and the like, and may be fabricated by electron beam evaporation, chemical vapor deposition, pulsed laser deposition, atomic layer deposition or sputtering.

The resistive material layer 402 is formed on the lower electrode M1 and may be fabricated by electron beam evaporation, chemical vapor deposition, pulsed laser deposition, atomic layer deposition or sputtering. The material of the resistive material layer comprises one or a combination of completely proportioned metal oxides such as $ZrO_2$, $HfO_2$, $TiO_2$, $SiO_2$, $Ta_2O_5$, $Y_2O_3$, and the like, and the thickness is between 5 nm and 60 nm, preferably, the thickness is 36 nm.

The selector material layer 202 is formed on the selector lower electrode 302 and is made of metal oxide or mixed ion-electron conducting (MIEC) material. Specifically, the selector material layer 202 may be formed by one or a combination of metal oxides such as $ZrO_2$, $HfO_2$, $TiO_2$, $SiO_2$, $Ta_2O_5$, $Y_2O_3$, $NbO_x$, $VO_2$, or may be formed by other compound materials, such as mixed ion-electron conducting (MIEC) materials. The selector material layer may be fabricated by electron beam evaporation, chemical vapor deposition, pulsed laser deposition, atomic layer deposition or sputtering, and the thickness is between 5 nm and 60 nm, preferably, the thickness is 38 nm.

Referring to FIG. 2, the outer walls of the word line metal M1, the resistive material layer 402, the selector lower electrode 302, the selector material layer 202, the selector upper electrode M2, the interconnection wire 102, and the bit line metal M3 are covered with an insulating layer 602, and the material of the insulating layer may be $SiO_2$. The insulating layer may also be fabricated by electron beam evaporation, chemical vapor deposition, pulsed laser deposition, atomic layer deposition or sputtering.

In another embodiment, as shown in FIGS. 2-7, the method for fabricating the 1S1R memory integrated structure includes the following steps.

Figure 3:
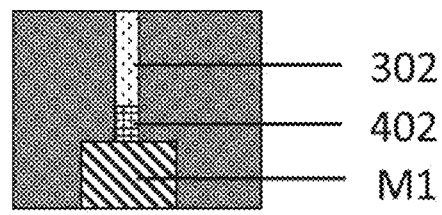
FIGS. 3-7 are schematic diagrams showing a fabricating process of the 1S1R memory integrated structure according to an embodiment of the present disclosure.

Step 1: the lower electrode M1, the resistive material layer 402, and the interconnection wire 302 are formed using a standard CMOS process, as shown in FIG. 3.

Specifically, the lower electrode M1, the resistive material layer 402 and the interconnection wire 302 may be fabricated by one way of electron beam evaporation, chemical vapor deposition, pulsed laser deposition, atomic layer deposition, and sputtering. The material of the resistive material layer 402 may be one of completely proportioned metal oxides such as $ZrO_2$, $HfO_2$, $TiO_2$, $SiO_2$, $Ta_2O_5$, $Y_2O_3$, and the like, and the thickness of the material is between 5 nm and 60 nm.

Figure 4:
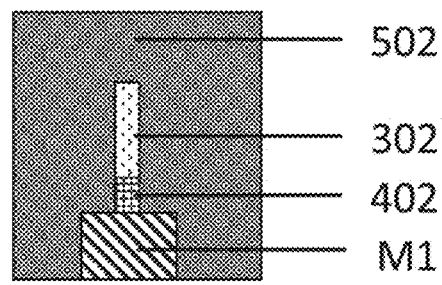

Step 2: an insulating layer 502 is grown on the interconnection wire 302, as shown in FIG. 4.

The material of the insulating layer may be $SiO_2$. The insulating layer 502 is grown by one of electron beam evaporation, chemical vapor deposition, pulsed laser deposition, atomic layer deposition, and sputtering.

Figure 5:
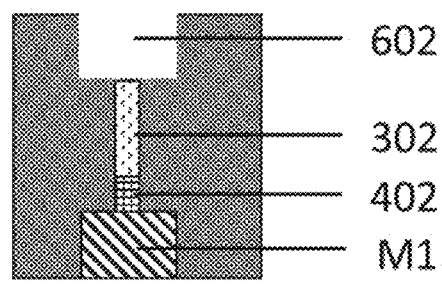

Step 3: the insulating layer is etched to form a deep groove 602 on the insulating layer, as shown in FIG. 5.

Specifically, in the step of etching the insulating layer, the insulating layer is etched to an upper surface of the interconnection wire, and a bottom surface of the deep groove 602 thus formed is flush with the upper surface of the interconnection wire.

Figure 6:
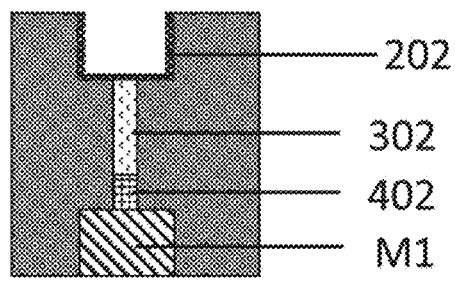

Step 4: the selector material layer 202 is fabricated by one of electron beam evaporation, chemical vapor deposition, pulsed laser deposition, atomic layer deposition, and sputtering. Then the structure shown in FIG. 6 is obtained by a smoothing process.

Specifically, the selector material layer may be formed by one of metal oxides such as $ZrO_2$, $HfO_2$, $TiO_2$, $SiO_2$, $Ta_2O_5$, $Y_2O_3$, $NbO_x$, $VO_2$, or may be formed by other compound materials, such as mixed ion-electron conducting (MIEC) materials.

Figure 7:
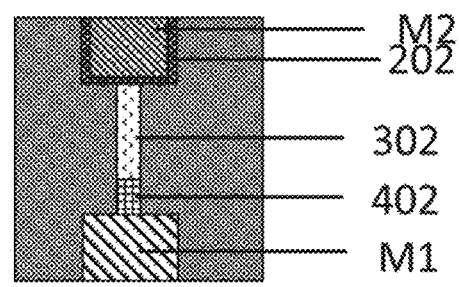

Step 5: the upper electrode M2 is grown on the selector material layer 202, and then the structure shown in FIG. 7 is obtained by a smoothing process.

Step 6: the interconnection wire 102 and the bit line metal M3 are implemented by a standard CMOS process, and the 1S1R memory integrated structure as shown in FIG. 2 is obtained.

In the method of this embodiment, the metal electrodes M1, M2, the bit line metal M3, and the interconnection wires 303 and 103 may be made of a metal element such as W, Cu, and the like, and may be fabricated by electron beam evaporation, chemical vapor deposition, pulsed laser deposition, atomic layer deposition or sputtering.

Figure 8:
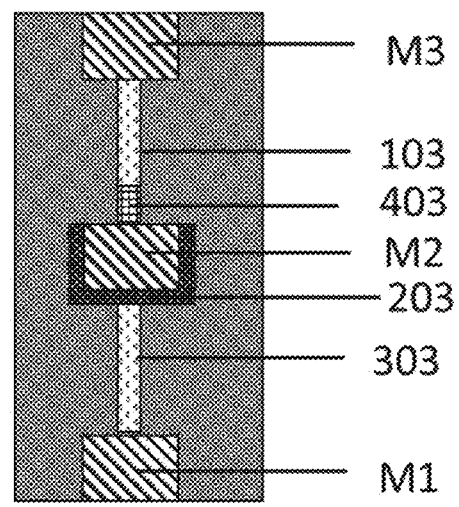
FIG. 8 is a schematic diagram of a 1S1R memory integrated structure according to still another embodiment of the present disclosure.

In another embodiment, as shown in FIG. 8, the 1S1R memory integrated structure sequentially includes, from bottom to top, a memory word line metal and lower electrode M1, a selector lower electrode 303 (which also serves as a memory upper electrode and an interconnection wire), a selector material layer 203, a selector upper electrode M2, a resistive material layer 403, an interconnection wire 103 and a bit line metal M3.

Different from the 1S1R memory integrated structure in the previous embodiment, the resistive material layer is formed on the selector upper electrode in the present embodiment, whereas the resistive material layer is formed on the word line metal in the previous embodiment. The other components of the 1S1R memory integrated structure of the present embodiment are the same as those of the previous embodiment, and the corresponding fabricating methods are similar to the foregoing fabricating methods, and are not described herein again.

Heretofore, the embodiments of the present disclosure have been described in detail in conjunction with the accompanying drawings. Based on the above description, those skilled in the art should have a clear understanding of the 1S1R memory integrated structure and its fabricating method of the present disclosure.

It should be noted that the implementations that are not shown or described in the drawings or the text of the specification are all known to those of ordinary skill in the art and are not described in detail. In addition, the above definitions of the various elements are not limited to the specific structures and shapes mentioned in the embodiments, and those skilled in the art may simply change or replace them. An example of parameters including specific values may be provided herein, however, these parameters need not be exactly equal to the corresponding values, but may approximate the corresponding values within acceptable error tolerances or design constraints. The directional terms mentioned in the embodiments, such as "upper", "lower", "front", "back", "left", "right", and the like, are merely referring to the directions of the drawings, and are not intended to limit the scope of protection of the present disclosure. The above embodiments may be used in combination with each other or with other embodiments based on design and reliability considerations, that is, the technical features in different embodiments may be freely combined to form more embodiments.

The above description of the disclosed embodiments enables those skilled in the art to implement or use the present application. Various modifications to these embodiments are obvious to those skilled in the art, and the general principles defined herein may be implemented in other embodiments without departing from the spirit or scope of the present application. Therefore, this disclosure will not be limited to these embodiments shown herein, but shall conform to the broadest range consistent with the principles and novel features disclosed herein.

It should be noted that the implementations that are not shown or described in the drawings or the text of the specification are all known to those of ordinary skill in the art and are not described in detail. In addition, the above definitions of the various elements and methods are not limited to the specific structures, shapes or manners mentioned in the embodiments, and those skilled in the art can simply modify or replace them.

The specific embodiments described above further elaborate on the purpose, technical solution and beneficial effect of this disclosure. It should be understood that the foregoing are only specific embodiments of the this disclosure and are not used to limit this disclosure, and that any modifications, equivalent substitutions, improvements, and the like, made within the spirit and principles of this disclosure shall be included in the scope of protection of this disclosure.

What is claimed is:

1. A 1S1R memory cell, comprising: a word line metal, a resistive material layer, a first selector electrode, a selector material layer, a second selector electrode, an interconnection wire, and a bit line metal;
    wherein the selector material layer is in a shape of a groove, and the second selector electrode is formed in the groove,
    wherein an area of the selector material layer is larger than an area of the resistive material layer, and
    wherein the word line, the bit line, the interconnection wire, the resistive material layer, and the selector material layer are formed by a process of electron beam evaporation, chemical vapor deposition, pulsed laser deposition, atomic layer deposition, or sputtering; a material of the word line, the bit line and the interconnection wire comprises W or Cu; a thickness of the resistive material layer is between 5 nm and 60 nm, and a material of the resistive material layer comprises one or a combination of $ZrO_2$, $HfO_2$, $TiO_2$, $SiO_2$, $Ta_2O_5$, and $Y_2O_3$; and a thickness of the selector material layer is between 5 nm and 60 nm, and a material of the selector material layer comprises a metal oxide or a mixed ion-electron conducting (MIEC) material; the metal oxide comprises one or a combination of $ZrO_2$, $HfO_2$, $TiO_2$, $SiO_2$, $Ta_2O_5$, $Y_2O_3$, NbOx, and $VO_2$.

2. The 1S1R memory cell of claim 1, further comprising a first memory electrode and a second memory electrode, wherein the word line metal is also used as the first memory electrode of the 1S1R memory cell, and the first selector electrode is also used as the second memory electrode of the 1S1R memory cell and an interconnection wire.

3. The 1S1R memory cell of claim 1, wherein the resistive material layer is on the word line metal or on the second selector electrode.

4. A method for fabricating a 1S1R memory cell, comprising:
    forming sequentially, from bottom to top, a word line metal, a resistive material layer and a first selector electrode;
    forming an insulating layer on the first selector electrode, etching the insulating layer to form a groove structure;
    forming a groove-shaped selector material layer in the groove structure;
    forming a second selector electrode in the groove of the selector material layer; and
    forming sequentially an interconnection wire and a bit line metal on the second selector electrode,
    wherein the 1S1R memory cell further comprises a first memory electrode and a second memory electrode, the word line metal is also used as the first memory electrode of the 1S1R memory cell, and the first selector electrode is also used as the second memory electrode of the 1S1R memory cell and an interconnection wire; an area of the formed selector material layer is greater than an area of the resistive material layer, and
    wherein the word line, the bit line, the interconnection wire, the resistive material layer, and the selector material layer are formed by a process of electron beam evaporation, chemical vapor deposition, pulsed laser deposition, atomic layer deposition, or sputtering; a material of the word line, the bit line and the interconnection wire comprises W or Cu; a thickness of the resistive material layer is between 5 nm and 60 nm, and a material of the resistive material layer comprises one or a combination of $ZrO_2$, $HfO_2$, $TiO_2$, $SiO_2$, $Ta_2O_5$, and $Y_2O_3$; a thickness of the selector material layer is between 5 nm and 60 nm, and a material of the selector material layer comprises a metal oxide or a mixed ion-electron conducting (MIEC) material; the metal oxide comprises one or a combination of $ZrO_2$, $HfO_2$, $TiO_2$, $SiO_2$, $Ta_2O_5$, $Y_2O_3$, NbOx, and $VO_2$; and a material of the insulating layer comprises $SiO_2$.

5. The method for fabricating the 1S1R memory cell of claim 4, wherein in the etching of the insulating layer, the insulating layer is etched to an upper surface of the interconnection wire, and thus a bottom surface of the groove structure is flush with the upper surface of the interconnection wire.

6. A method for fabricating a 1S1R memory cell, comprising:
   forming sequentially, from bottom to top, a word line metal and a first selector electrode;
   forming an insulating layer on the first selector electrode, etching the insulating layer to form a groove structure;
   forming a groove-shaped selector material layer in the groove structure;
   forming a second selector electrode in the groove of the selector material layer; and
   forming sequentially a resistive material layer, an interconnection wire and a bit line metal on the second selector electrode,
   wherein the 1S1R memory cell further comprises a first memory electrode and a second memory electrode, the word line metal is also used as the first memory electrode of the 1S1R memory cell, and the first selector electrode is also used as the second memory electrode of the 1S1R memory cell and an interconnection wire; an area of the formed selector material layer is greater than an area of the resistive material layer, and wherein the word line, the bit line, the interconnection wire, the resistive material layer, and the selector material layer are formed by a process of electron beam evaporation, chemical vapor deposition, pulsed laser deposition, atomic layer deposition, or sputtering; a material of the word line, the bit line and the interconnection wire comprises W or Cu; a thickness of the resistive material layer is between 5 nm and 60 nm, and a material of the resistive material layer comprises one or a combination of $ZrO_2$, $HfO_2$, $TiO_2$, $SiO_2$, $Ta_2O_5$, and $Y_2O_3$; a thickness of the selector material layer is between 5 nm and 60 nm, and a material of the selector material layer comprises a metal oxide or a mixed ion-electron conducting (MIEC) material; the metal oxide comprises one or a combination of $ZrO_2$, $HfO_2$, $TiO_2$, $SiO_2$, $Ta_2O_5$, $Y_2O_3$, NbOx, and $VO_2$; and a material of the insulating layer comprises $SiO_2$.

7. The method for fabricating the 1S1R memory cell of claim 6, wherein in the etching of the insulating layer, the insulating layer is etched to an upper surface of the interconnection wire, and thus a bottom surface of the groove structure is flush with the upper surface of the interconnection wire.

* * * * *